United States Patent
Nagarah et al.

(10) Patent No.: US 9,040,430 B2
(45) Date of Patent: May 26, 2015

(54) METHOD OF STRIPPING ORGANIC MASK WITH REDUCED DAMAGE TO LOW-K FILM

(71) Applicant: Lam Research Corporation, Fremont, CA (US)

(72) Inventors: John M. Nagarah, San Jose, CA (US); Gerardo Delgadino, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/929,530

(22) Filed: Jun. 27, 2013

(65) Prior Publication Data

US 2015/0004797 A1    Jan. 1, 2015

(51) Int. Cl.
H01L 21/302    (2006.01)
H01L 21/311    (2006.01)
H01L 21/02    (2006.01)

(52) U.S. Cl.
CPC .... H01L 21/31144 (2013.01); H01L 21/02093 (2013.01)

(58) Field of Classification Search
CPC ............... H01L 21/02093; H01L 21/31127; H01L 21/31144
USPC ................................... 438/725, 743
See application file for complete search history.

(56) References Cited

U.S. PATENT DOCUMENTS

| | | | |
|---|---|---|---|
| 7,294,580 B2 | 11/2007 | Yun et al. | |
| 7,399,712 B1* | 7/2008 | Graff | 438/725 |
| 7,790,047 B2 | 9/2010 | Huang et al. | |
| 2008/0135517 A1* | 6/2008 | Balasubramaniam | 216/67 |

* cited by examiner

*Primary Examiner* — Binh X Tran
(74) *Attorney, Agent, or Firm* — Beyer Law Group LLP

(57) ABSTRACT

A method for stripping an organic mask above a porous low-k dielectric film is provided. A steady state flow of a stripping gas, comprising $CO_2$ and $CH_4$ is provided. The stripping gas is formed into a plasma, wherein the plasma strips at least half the organic mask and protects the porous low-k dielectric film, for a duration of providing the steady state flow of the stripping gas.

16 Claims, 5 Drawing Sheets

METHOD OF STRIPPING ORGANIC MASK WITH REDUCED DAMAGE TO LOW-K FILM

BACKGROUND OF THE INVENTION

The present invention relates to the fabrication of semiconductor-based devices. More particularly, the present invention relates to improved techniques for fabricating semiconductor-based devices with low-k dielectric layers.

In semiconductor-based device (e.g., integrated circuits or flat panel displays) manufacturing, dual damascene structures may be used in conjunction with copper conductor material to reduce the RC delays associated with signal propagation in aluminum based materials used in previous generation technologies. In dual damascene, instead of etching the conductor material, vias and trenches may be etched into the dielectric material and filled with copper (referred to as "metallization"). The excess copper may be removed by chemical mechanical polishing (CMP) leaving copper lines connected by vias for signal transmission. To reduce the RC delays even further, porous low-k dielectric constant materials may be used. In the specification and claims, low-k is defined as k<4.0.

Porous low dielectric constant materials may include organo-silicate glass (OSG) materials, which are also called carbon-doped silicates. OSG materials may be silicon dioxide doped with organic components such as methyl groups. OSG materials have carbon and hydrogen atoms incorporated into a silicon dioxide lattice, which lowers the dielectric constant of the material. However, OSG materials may be susceptible to damage when exposed to $O_2$, $H_2$, $N_2$, and $NH_3$ gases, which are used for stripping organic material or fluorine within a stripping plasma. It is believed that such damage may be caused by the removal of carbon from the low-k dielectric, which increases the dielectric constant and makes the material more hydrophilic so that it retains moisture. The retention of moisture creates metal barrier adhesion problems or may cause other barrier problems.

The damaging effects of stripping plasmas can penetrate deeper into porous material, compared to non-porous (dense) materials. Porous OSG materials (with k<~2.5) may be very susceptible to damage due to the removal of organic content by exposure to the plasma used to strip the mask and/or sidewalls. For example, organic mask ashing or stripping process is one of the process steps that cause the most significant damage to such porous low-k dielectric layer, in which the organic mask is stripped off under plasma systems. The plasma may diffuse into the pores of the porous OSG layer and cause damage as far as 300 nm into the OSG layer. Part of the damage caused by the plasma is the removal of carbon and hydrogen from the damaged area causing the OSG to be more like silicon dioxide, which has a higher dielectric constant. Damage may be quantified by measuring the change in SiC/SiO ratio of the OSG layer from FTIR analysis. For the typical trench etch application, the modification of OSG more than 3-5 nm into the trench sidewall is unacceptable.

SUMMARY OF THE INVENTION

To achieve the foregoing and other objectives and in accordance with the purpose of the present invention, a method for stripping an organic mask above a porous low-k dielectric film is provided. A steady state flow of a stripping gas, comprising $CO_2$ and $CH_4$ is provided. The stripping gas is formed into a plasma, wherein the plasma strips at least half the organic mask and protects the porous low-k dielectric film, for a duration of providing the steady state flow of the stripping gas.

In another manifestation of the invention, a method for stripping an organic mask above an etched low-k dielectric film is provided. A steady state flow of a stripping gas, comprising a stripping component and a hydrocarbon or fluorocarbon; is provided. The stripping gas is formed into a plasma, wherein the plasma strips the organic mask and protects the low-k dielectric film.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Without being bound by theory, it is believed that most of the damage to the low-k dielectric layer occurs during stripping, because stripping removes an organic resist material, and this process tends to also remove carbon from the low-k dielectric material. In addition, it is believed that damage is more noticeable as a result of a trench strip than a via strip, since trenches are more closely spaced and having more capacitance between each other. It is also believed that such damage is a greater problem with small features than large features and that such damage is more of a problem on the sidewall of a trench than the bottom of a trench.

Figure 1:
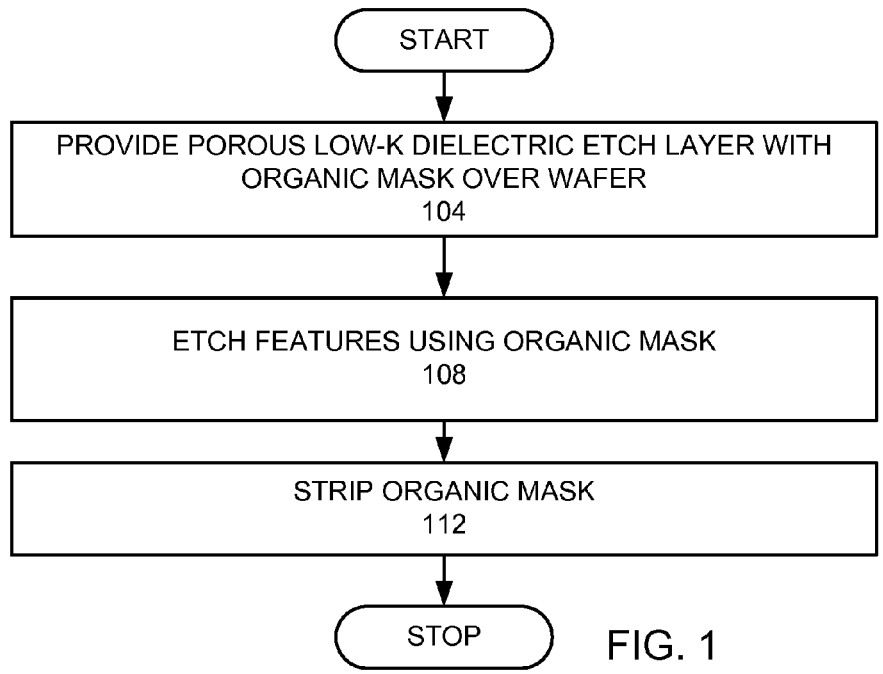
FIG. 1 is a high level flow chart of an embodiment of the invention.
Figure 2:
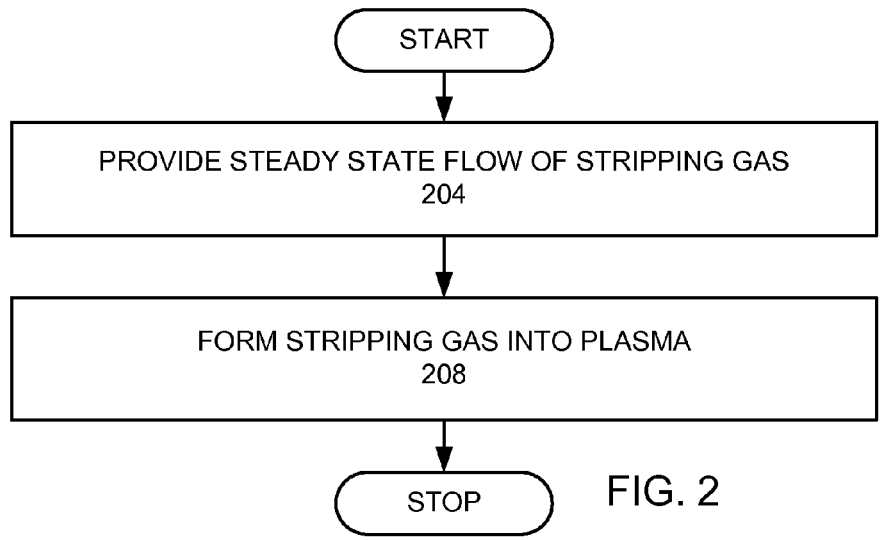
FIG. 2 is a more detailed flow chart of a step of stripping an organic mask.

To facilitate discussion, FIG. 1 is a high level flow chart of an etching process of a stack of layers including a porous low-k dielectric layer used in an embodiment of the invention. A porous low-k dielectric layer is provided on a wafer and is disposed below an organic mask, such as a patterned photoresist mask or carbon hard mask (step 104). The organic mask is used to etch features (step 108). The organic mask is stripped (step 112). FIG. 2 is a more detailed flow chart of the stripping of the organic mask used in an embodiment of the invention, which uses a steady state stripping process. A steady state flow of a stripping gas is provided (step 204). The steady state stripping gas comprises a stripping component and a hydrocarbon or fluorocarbon. A hydrofluorocarbon is considered a hydrocarbon or fluorocarbon. The stripping gas is formed into a plasma (step 208).

Figure 3A:
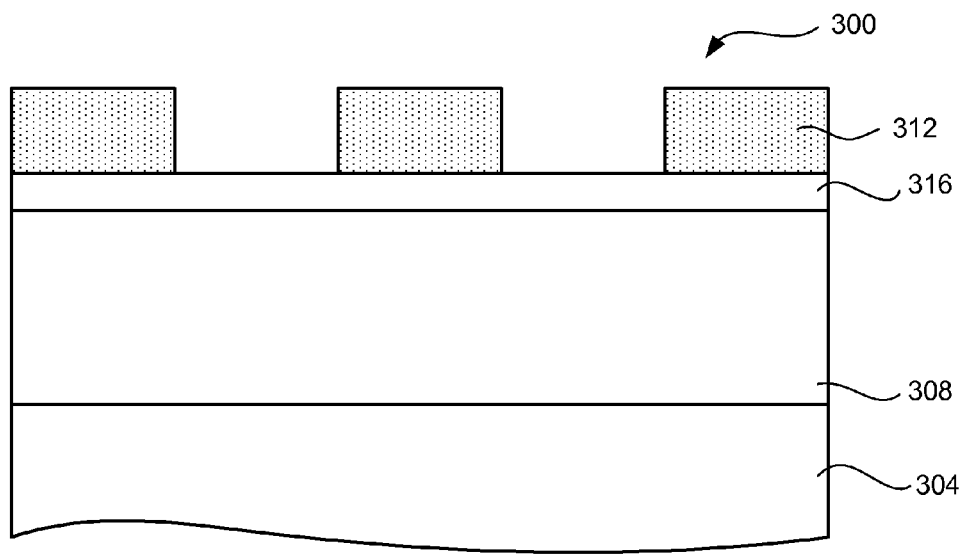
FIGS. 3A-C are schematic cross-sectional views of a stack processed according to an embodiment of the invention.

In an example of an embodiment of the invention, a patterned organic mask is formed over a porous low-k dielectric layer over a wafer (step 104). FIG. 3A is a schematic cross-sectional view of a stack 300 of a wafer 304 over which a porous low-k dielectric layer 308 is formed over which a patterned organic mask 312 is formed. Preferably, the porous low-k dielectric layer 308 is an organo-silicate glass (OSG) material. Preferably, the patterned organic mask 312 is a carbon hard mask, such as amorphous carbon. Preferably, the wafer 304 is a silicon wafer. One or more layers may be disposed between the low-k dielectric layer 308 and the organic mask 312. In this example, a hard mask layer 316 of TiN is disposed between the low-k dielectric layer 308 and the organic mask 312. One or more layers may be disposed between the low-k dielectric layer 308 and the wafer 304. In this example there are no intermediate layers between the low-k dielectric layer 308 and the wafer 304.

Figure 3B:
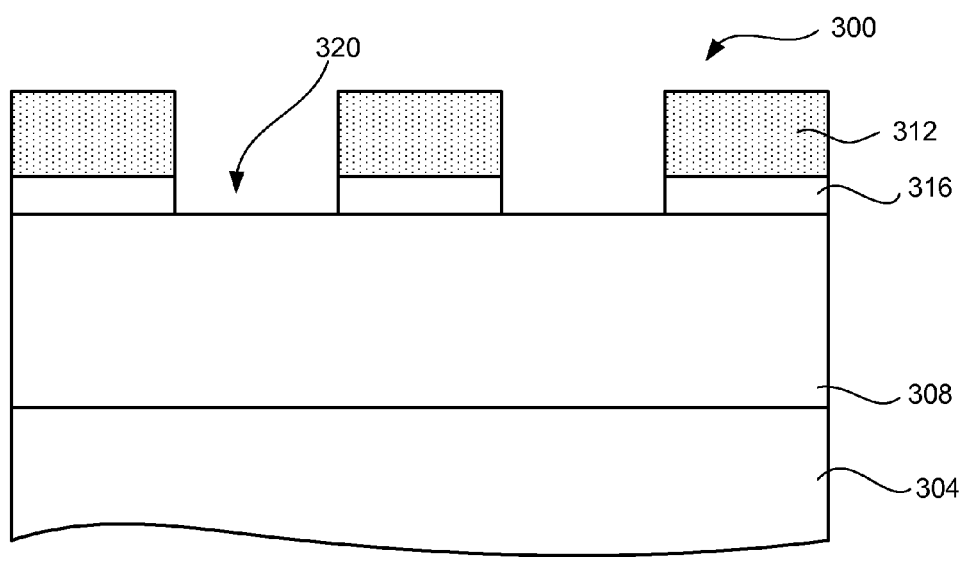

The organic mask 312 is used to etch features (step 108). In this example, the organic mask 312 is used as a pattern for etching features 320 into the hard mask layer 316, as shown in FIG. 3B.

Figure 4:
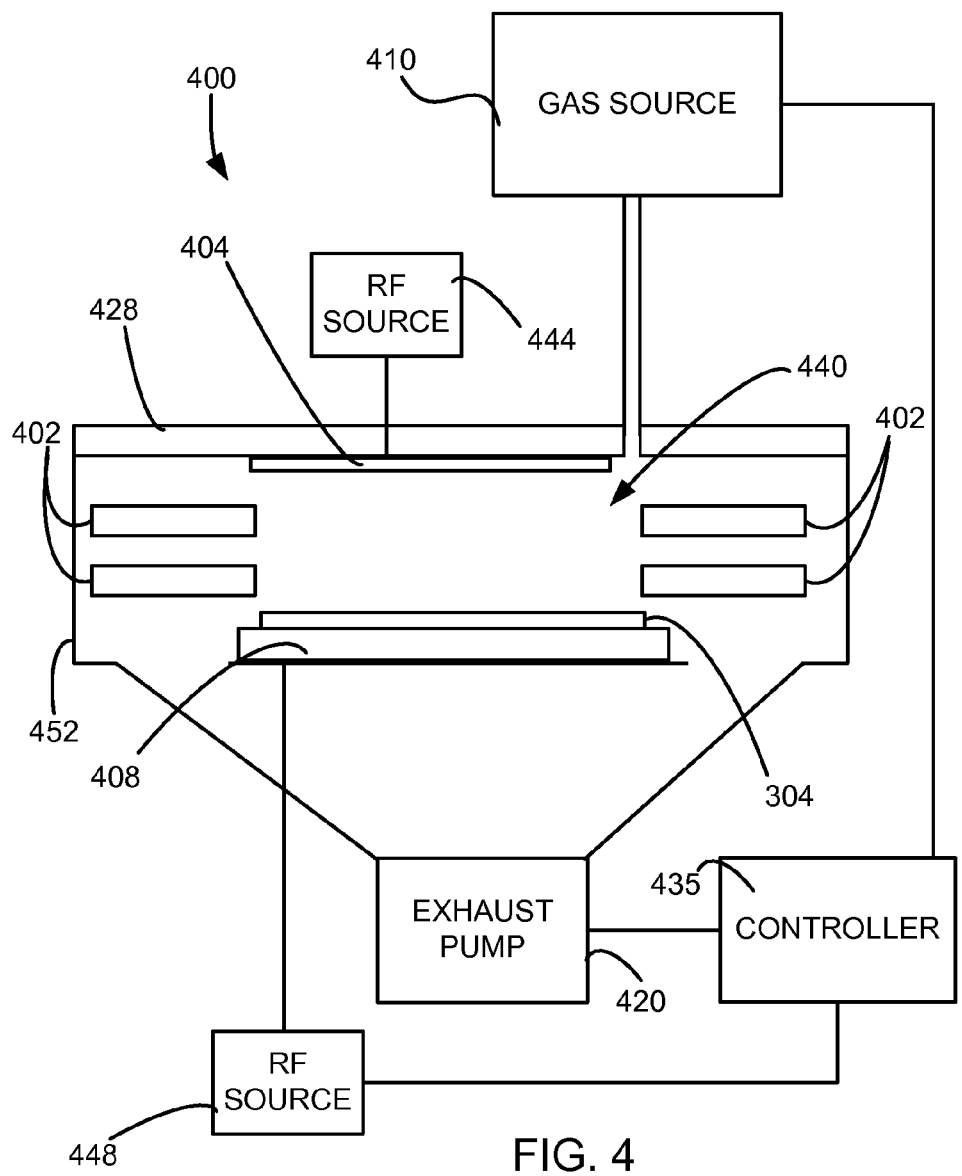
FIG. 4 is a schematic view of a process chamber that may be used in an embodiment of the invention.

The patterned organic mask 312 is stripped (step 112). In this example, the wafer 304 is placed in a stripping chamber. FIG. 4 is a schematic view of a plasma processing chamber 400 that may be used for stripping the organic mask. In this example, the chamber may also be used for etching/patterning other layers in situ. The plasma processing chamber 400 comprises confinement rings 402, an upper electrode 404, a lower electrode 408, a gas source 410, and an exhaust pump 420. Within the plasma processing chamber 400, the wafer 304 is positioned upon the lower electrode 408. The lower electrode 408 incorporates a suitable substrate chucking mechanism (e.g., electrostatic, mechanical clamping, or the like) for holding the wafer 304. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume 440 by the gas source 410 and is exhausted from the confined plasma volume 440 through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source, a 60 MHz power source, and a 2 MHz power source. Different combinations for connecting different frequencies of RF power to the upper and lower electrode are possible. A controller 435 is controllably connected to the first RF source 444, the second RF source 448, the exhaust pump 420, and the gas source 410. The controller 435 is able to control the flow rate of the various gases. In the case of Lam Research Corporation's Dielectric Etch Systems such as Exelan® Series, made by LAM Research Corporation™ of Fremont, Calif., which may be used in a preferred embodiment of the invention, the 60 MHz, 27 MHz, and 2 MHz power sources make up the second RF power source 448 connected to the lower electrode 408, and the upper electrode 404 is grounded.

Figure 5:
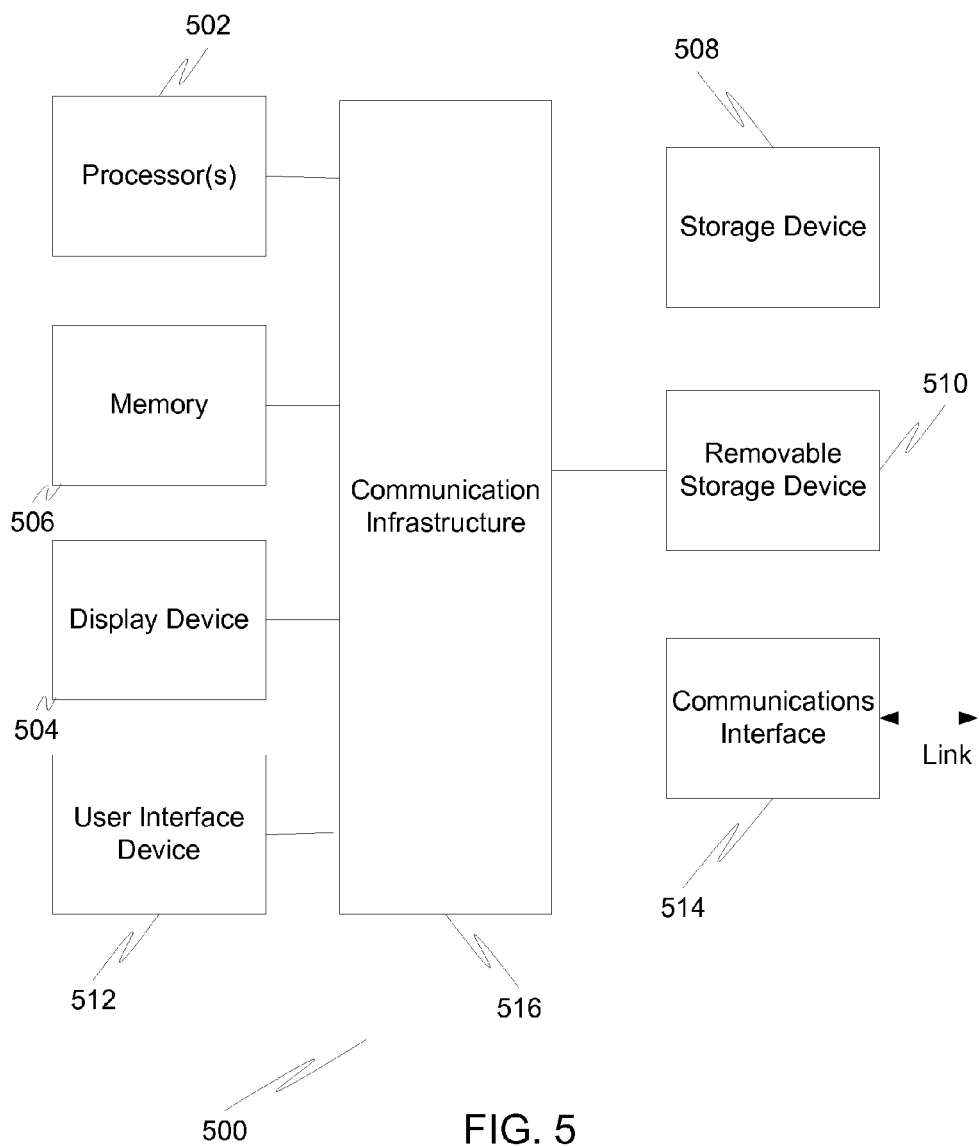
FIG. 5 is a schematic view of a computer system that may be used as a controller.

FIG. 5 is a high level block diagram showing a computer system 500, which is suitable for implementing a controller 435 used in embodiments of the present invention. The computer system may have many physical forms ranging from an integrated circuit, a printed circuit board, and a small handheld device up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In this example, the organic mask 312 is used to etch features 320 into the hard mask layer 316 to form a pattern hard mask. A conventional etch process may be used here.

The organic mask is stripped (step 112). To provide the stripping of the organic mask, a steady state flow of a stripping gas is provided (step 204). In this example, the stripping gas comprises 700 sccm $CO_2$ and 40 sccm $CH_4$. A pressure of 40 mTorr was maintained. The stripping gas is formed into a plasma (step 208). To form the stripping gas into a plasma, 600 watts RF was provided at 60 MHz. Since lower RF power was not provided in this example, a low or no bias was provided. The 60 MHz RF provides a high plasma density with no or low bias.

Figure 3C:
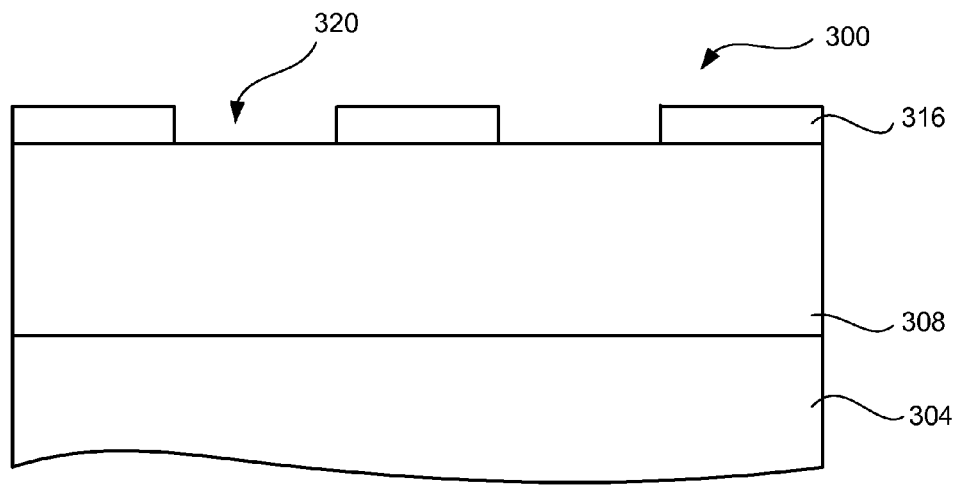

Preferably, the steady state plasma and the steady state flow of the stripping gas is provided until at least half of the organic mask is stripped. More preferably, the steady state plasma is provided until all of the organic mask is stripped. Preferably, the steady state flow of the stripping gas is flowed continuously for at least 60 seconds. More preferably the steady state flow of the stripping gas is flowed for at least 80 seconds. FIG. 3C is a schematic cross-sectional view of a stack 300 of a wafer 304 after the organic mask has been stripped.

Additional steps may be provided, such as etching the porous low-k dielectric layer 308 through the hard mask 316 and then stripping the hard mask 316. In addition, the hard mask layer 316 would be formed on the porous low-k dielectric layer 308 before the organic mask layer 312 is formed.

In experiments it was found that recipes with a methane ($CH_4$) additive to a steady state stripping gas provided the lowest low-k damage. It has been found that the methane protects the low-k dielectric film, by reducing or eliminating damage to the low-k dielectric film. If there is damage to the low-k dielectric film during the stripping, it is found that such damage is less than the damage caused by the same process, but without the methane additive.

A $CH_4$ additive may reduce low-k damage during stripping for other steady state stripping gas recipes. In other embodiments, other hydrocarbons may be used. However, $CH_4$ is preferred in an embodiment, since $CH_4$ is a lighter carbon containing molecule and has been found to provide a higher stripping rate. In addition, it has been unexpectedly found that the addition of $CH_4$ reduces etching of the hard mask during the stripping. By reducing the etching of the hard mask, the CD of the hard mask is minimized. Other embodiments may provide larger hydrocarbons, which may reduce damage, but may also reduce the stripping rate. In addition, the addition of $CH_4$ causes the surface of the porous low-k dielectric layer to be smoother.

In some embodiments, the stripping plasma may pulse various parameters. However, such stripping processes still use a steady state flow of stripping gas. Hydrocarbons may have a fluorine component. However, in the preferred embodiment, the stripping gas is fluorine free.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications and various substitute equivalents as fall within the true spirit and scope of the present invention.

What is claimed is:

1. A method for processing an amorphous carbon mask above a hardmask layer above a porous low-k dielectric film, comprising:
    etching features into the hardmask layer through the amorphous carbon mask;
    stripping the amorphous carbon mask after etching features into the hardmask layer, comprising:
        providing a steady state flow of a stripping gas, comprising a stripping component and a hydrocarbon or fluorocarbon; and
        forming the stripping gas into a plasma, wherein the plasma strips the-amorphous carbon mask and protects the porous low-k dielectric film;
    etching features into the porous low-k dielectric film through the hardmask layer after stripping the amorphous carbon mask.

2. The method, as recited in claim 1, wherein the stripping component comprises an oxidizing component or reducing component.

3. The method, as recited in claim 1, wherein the stripping component comprises at least one of $O_2$, $CO_2$, $H_2$ or $N_2$.

4. The method, as recited in claim 1, wherein the stripping component comprises an oxidizing component.

5. The method, as recited in claim 1, wherein the stripping component is $CO_2$.

6. The methods, as recited in claim 1, wherein the stripping component is $CO_2$ and the hydrocarbon or fluorocarbon is $CH_4$.

7. The method, as recited in claim 3, wherein the stripping the amorphous carbon mask strips the entire amorphous carbon mask.

8. The method, as recited in claim 1, wherein the hydrocarbon or fluorocarbon is a hydrocarbon, and wherein the stripping gas is fluorine free.

9. The method, as recited in claim 8, wherein the hydrocarbon is methane or ethane.

10. The method, as recited in claim 1, wherein more than half of the amorphous carbon mask is stripped during a duration of the steady state flow of the stripping gas.

11. The method, as recited in claim 10, wherein the stripping component comprises an oxidizing component or reducing component.

12. The method, as recited in claim 11, wherein the hydrocarbon or fluorocarbon is a hydrocarbon, and wherein the stripping gas is fluorine free.

13. The method, as recited in claim 12, wherein the hydrocarbon is methane or ethane.

14. The method, as recited in claim 13, wherein the stripping component is $CO_2$.

15. The method, as recited in claim 13, wherein the stripping component comprises at least one of $O_2$, $CO_2$, $H_2$ or $N_2$.

16. The method, as recited in claim 15, wherein the stripping component comprises an oxidizing component.

* * * * *